United States Patent
Chen et al.

(10) Patent No.: US 7,660,124 B2
(45) Date of Patent: Feb. 9, 2010

(54) DIGITAL MICROMIRROR DEVICE MODULE

(75) Inventors: Jung-Chi Chen, Hsinchu (TW); Che-Hsueh Chen, Hsinchu (TW)

(73) Assignee: Coretronic Corporation, Hsinchu (TW)

( * ) Notice: Subject to any disclaimer, the term of this patent is extended or adjusted under 35 U.S.C. 154(b) by 1 day.

(21) Appl. No.: 12/209,446

(22) Filed: Sep. 12, 2008

(65) Prior Publication Data
US 2009/0135564 A1 May 28, 2009

(30) Foreign Application Priority Data
Nov. 27, 2007 (TW) .............................. 96144933 A

(51) Int. Cl.
*H05K 7/20* (2006.01)
(52) U.S. Cl. ...................... 361/719; 361/704; 361/707; 361/715; 257/706; 257/712; 257/718; 257/727; 165/80.3
(58) Field of Classification Search ................. 361/704, 361/707, 715, 719; 257/706, 712, 718, 727; 165/80.3
See application file for complete search history.

(56) References Cited
U.S. PATENT DOCUMENTS

| | | | | |
|---|---|---|---|---|
| 6,791,838 B1 * | 9/2004 | Hung et al. | ................. | 361/704 |
| 6,816,375 B2 * | 11/2004 | Kalyandurg | ................. | 361/704 |
| 6,914,783 B2 * | 7/2005 | Rogers et al. | ............... | 361/709 |
| 2006/0176453 A1 * | 8/2006 | Miyamoto | .................. | 353/119 |
| 2006/0227514 A1 * | 10/2006 | Kang et al. | .................. | 361/719 |
| 2008/0247168 A1 * | 10/2008 | Chien et al. | ................. | 362/294 |
| 2009/0086171 A1 * | 4/2009 | Sun | ............................. | 353/52 |

* cited by examiner

*Primary Examiner*—Boris L Chervinsky
(74) *Attorney, Agent, or Firm*—Thomas, Kayden, Horstemeyer & Risley

(57) ABSTRACT

A digital micromirror device (DMD) module includes a circuit board, a DMD element, a soft elastic pad, a heat dissipation pad and a heat sink. The circuit board includes a first surface, a second surface and a through hole, wherein the first surface is opposite to the second surface. The DMD element is electrically connected to the circuit board. The soft elastic pad is disposed on the first surface of the circuit board and surrounds the through hole. The heat dissipation pad passes through the through hole and contacts the DMD element. The soft elastic pad is sandwiched between the circuit board and the heat sink, the heat dissipation pad is sandwiched between the heat sink and the DMD element, and the heat sink contacts the soft elastic pad and the heat dissipation pad, so as to apply a force to the soft elastic pad and the heat dissipation pad.

18 Claims, 3 Drawing Sheets

DIGITAL MICROMIRROR DEVICE MODULE

CROSS REFERENCE TO RELATED APPLICATIONS

This application claims priority of Taiwan Patent Application No. 096144933, filed on Nov. 27, 2007, the entirety of which is incorporated by reference herein.

BACKGROUND OF THE INVENTION

1. Field of the Invention

The present invention relates to a Digital Micromirror Device (DMD) module, and more particularly to a DMD module with a simplified structure.

2. Description of the Related Art

In a Digital Micromirror Device (DMD) module, an electrical load controlling the electrical connection states and a thermal load controlling the heat connection states are adjusted according to the designing style of the DMD element, so as to improve electrical conduction and heat dissipation effect. Conventional DMD modules, for example, a DMD module made by Texas Instruments, utilizes shoulder screws and push nuts to control electrical load and thermal load, separately. Additionally, compression springs and flat springs are utilized in conventional DMD modules to provide electrical load and thermal load. The compression springs are telescoped on the shoulder screws and located between screw heads thereof and a heat sink to provide thermal load. The flat spring is located between a print circuit board and the heat sink. An end of the flat spring pushes the push nut allowing a lower portion of the shoulder screw to be inserted into the push nut, and the other end thereof contacts an upper portion of the shoulder screw to provide an electrical load.

Conventional DMD modules are complicated designed with many elements, for example, compression springs are telescoped on the multi section screws. The compression springs and multi section screws increase costs. Furthermore, the compression quantity of each compression spring differs from one another, thus, thermal load distribution is non-uniform, and heat dissipation is un-uniform. Additionally, for conventional DMD modules, O-rings or E-rings are required to be disposed between the heat sink and the flat spring, and further increase costs. Meanwhile, the flat spring may conduct the heat sink and the circuit board, and scratch the circuit board.

BRIEF SUMMARY OF THE INVENTION

The present invention relates to a DMD module with simplified structure and reduced costs.

A detailed description is given in the following embodiments with reference to the accompanying drawings.

A DMD module is provided, including a circuit board, a DMD element, a soft elastic pad, a heat dissipation pad and a heat sink. The circuit board includes a first surface, a second surface and a through hole, wherein the first surface is opposite to the second surface. The DMD element is electrically connected to the circuit board. The soft elastic pad is disposed on the first surface of the circuit board and surrounds the through hole. The heat dissipation pad passes through the through hole and contacts the DMD element. The soft elastic pad is sandwiched between the circuit board and the heat sink, the heat dissipation pad is sandwiched between the heat sink and the DMD element, and the heat sink contacts the soft elastic pad and the heat dissipation pad to apply a force to the soft elastic pad and the heat dissipation pad.

In a modified embodiment, the DMD module further includes a housing and a plurality of fixers, wherein the fixers fix the heat sink and the circuit board to the housing to control a distance between the heat sink and the circuit board and to control a distance between the heat sink and the DMD element, simultaneously.

In a modified embodiment, a DMD module design method is provided and includes the following steps. First, a DMD module is provided, including a circuit board, a DMD element, a soft elastic pad, a heat dissipation pad and a heat sink. The circuit board includes a first surface, a second surface and a through hole, wherein the first surface is opposite to the second surface. The DMD element is electrically connected to the circuit board. The soft elastic pad is disposed on the first surface of the circuit board and surrounds the through hole. The heat dissipation pad passes through the through hole and contacts the DMD element. The soft elastic pad is sandwiched between the circuit board and a heat sink. The heat dissipation pad is sandwiched between the heat sink and the digital micromirror device element. The heat sink contacts the soft elastic pad and the heat dissipation pad to apply a force to the soft elastic pad and the heat dissipation pad. Next, thickness or material of the soft elastic pad is modified, so as to use the force provided by the soft elastic pad to modify an electrical load. Finally, thickness or material of the heat dissipation pad is modified, so as to use the force provided by the heat dissipation pad to modify a thermal load.

In the embodiment of the invention, the distance between the heat sink and the circuit board and the distance between the heat sink and the DMD element are modified simultaneously by the fixers. Therefore, the electrical load is modified by modifying thickness and material of the soft elastic pad, and the thermal load is modified by modifying thickness and material of the heat dissipation pad. Compared to the conventional art utilizing shoulder screws and push nuts to control electrical load and thermal load, the DMD module of the embodiment of the invention has no shoulder screws, no compression springs telescoped on fixers, and no additional O-rings or E-rings. The DMD module of the embodiment of the invention is easier to assemble, with a simplified structure and reduced costs. Compression quantities of the soft elastic pad and the heat dissipation pad are uniform, and thermal load distribution and heat dissipation are thus improved. Additionally, the soft elastic pad of rubber, insulates the heat sink from the circuit board, and prevents the circuit board from being scratched.

Other objectives, features and advantages of the present invention will be understood from further technology features disclosed by the embodiments of the present invention, shown and described simply by way of illustration of modes best suited to carry out the invention.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

In the following detailed descriptions of the embodiments of the present invention, reference is made to the accompanying drawings which form a part hereof, and in which are shown by way of illustration the method in which the present invention may be practiced. In this regard, directional terminology, such as "top," "bottom," "front," "back," etc., is used with reference to the orientation of the Figure(s) being described. Meanwhile, the components of the present invention can be positioned in a number of different orientations. As such, the directional terminology is used for purposes of illustration and is by no means limiting. Additionally, the drawings are only schematic and the sizes of components may be exaggerated for clarity. It is also to be understood that other embodiments may be utilized and structural changes may be made without departing from the general scope of the present invention. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless otherwise limited, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect surface-to-surface/directional orientations, and "adjacent to" and variations thereof herein are used broadly and encompass directly and indirectly "adjacent to" orientations. Therefore, the description of "A" component is facing "B" component herein may encompass situations where "A" component faces "B" component directly or one or more additional components are between "A" component and "B" component. Also, the description of "A" component is adjacent to "B" component herein may encompass situations where "A" component is directly adjacent to "B" component or one or more additional components are between "A" component and "B" component. Accordingly, the drawings and descriptions will be regarded as illustrative in nature and not as restrictive.

Figure 1:
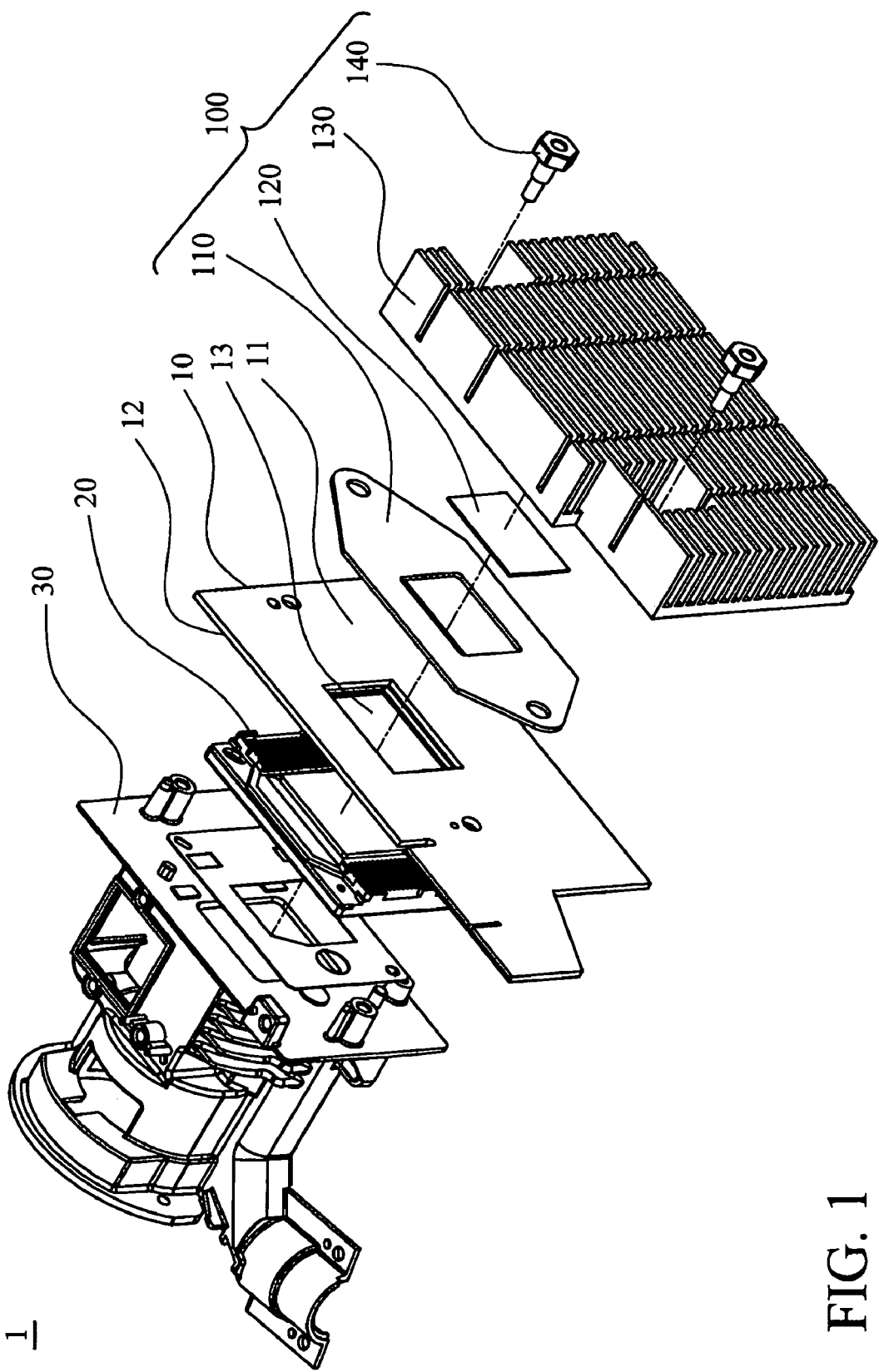
FIG. 1 shows a DMD module of a first embodiment of the invention.

FIG. 1 shows a DMD (Digital Micromirror Device) module 1 of a first embodiment of the invention including a circuit board 10, a DMD element 20, a socket (not shown), a housing 30 and a heat conducting unit 100. The heat conducting unit 100 includes a soft elastic pad 110, a heat dissipation pad 120, a heat sink 130 and a plurality of fixers 140.

The circuit board 10 includes a first surface 11, a second surface 12 and a through hole 13. The first surface 11 is opposite to the second surface 12. The socket (not shown) is welded on the second surface 12 of the circuit board 10. The DMD element 20 is electrically connected to the circuit board 10 via the socket. The soft elastic pad 110 is disposed on the first surface 11 and surrounds the through hole 13, so as to make the heat dissipation pad 120 pass through the through hole 13 and contact the DMD element 20. The soft elastic pad 110 is sandwiched between the heat sink 130 and the circuit board 10. The heat dissipation pad 120 is sandwiched between the DMD element 20 and the heat sink 130. The heat sink 130 contacts the soft elastic pad 110 and the heat dissipation pad 120 to directly apply a force to the soft elastic pad 110 and the heat dissipation pad 120. The fixers 140 fix the heat sink 130 and the circuit board 10 to the housing 30, for simultaneously modifying a distance between the heat sink 130 and the circuit board 10 and a distance between the heat sink 130 and the DMD element 20.

Figure 2:
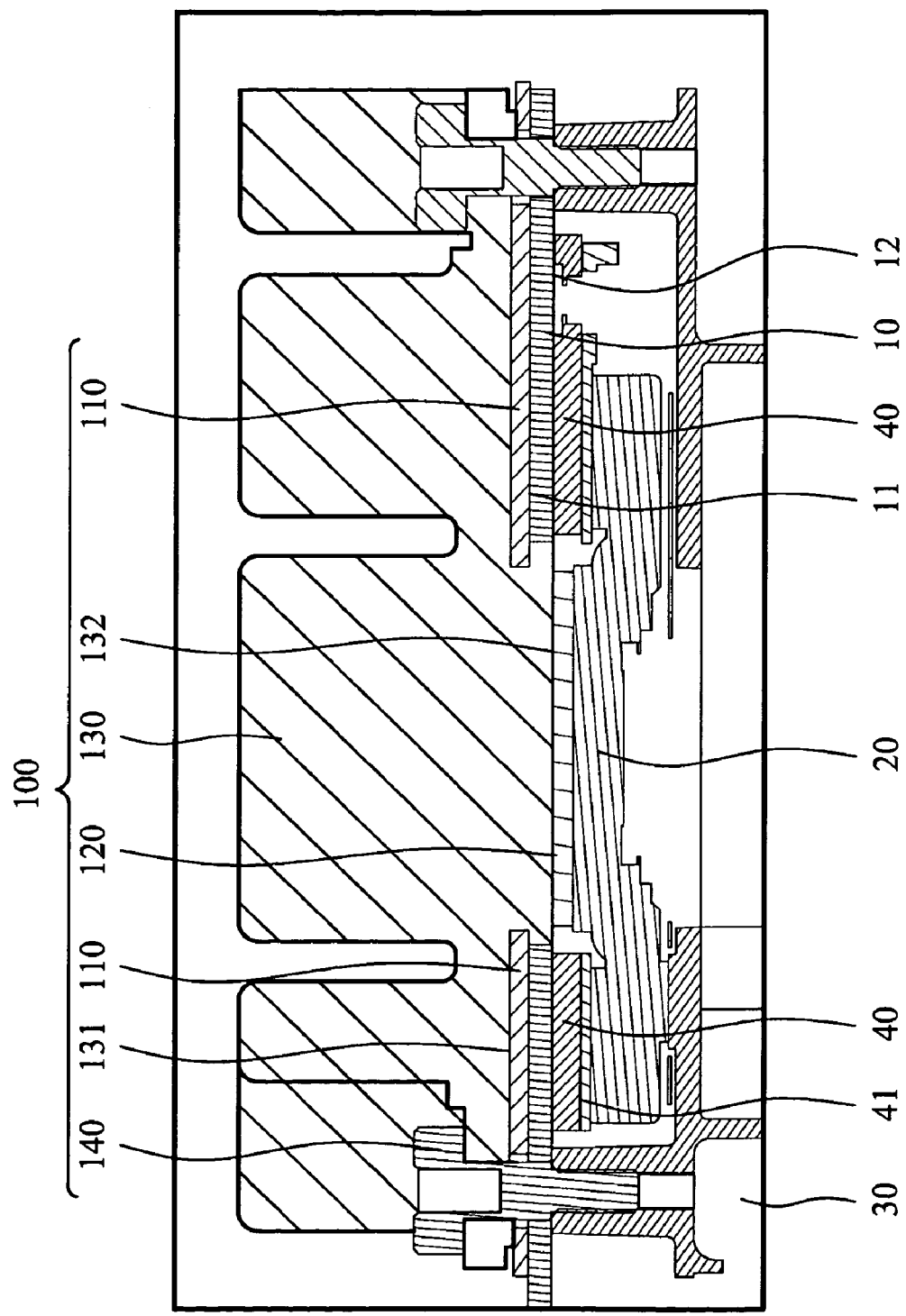
FIG. 2 is a partial sectional view of the DMD module of the first embodiment.

FIG. 2 is a partial sectional view of the DMD module 1, wherein the heat sink 130 includes a first abutting area 131 and a second abutting area 132. The first abutting area 131 contacts the soft elastic pad 110. The second abutting area 132 contacts the heat dissipation pad 120. The second abutting area 132 is protruding from the first abutting area 131. In one embodiment, the thermal load may be modified in the same electronic load by modifying a height difference between the first abutting area 131 and the second abutting area 132. The socket 40 includes an electronic contact area 41, and the soft elastic pad 110 corresponds to the electronic contact area 41. The soft elastic pad 110 is made of rubber. The fixers 140 are screws.

In the embodiment of the invention, the distance between the heat sink and the circuit board and the distance between the heat sink and the DMD element are modified simultaneously by fixers. Therefore, the electrical load is modified by modifying thickness and material of the soft elastic pad, and the thermal load is modified by modifying thickness and material of the heat dissipation pad. Compared to the conventional art utilizing shoulder screws and push nuts to control electrical load and thermal load, the DMD module of the embodiment of the invention has no shoulder screws, no compression springs telescoping on fixers, and no additional O-rings or E-rings. The DMD module of the embodiment of the invention is easier to assemble, with a simplified structure and reduced costs. Compression quantities of the soft elastic pad and the heat dissipation pad are uniform, and thermal load distribution and heat dissipation are thus improved. Additionally, the soft elastic pad of rubber insulates the heat sink from the circuit board, and prevents the circuit board from being scratched.

Figure 3:
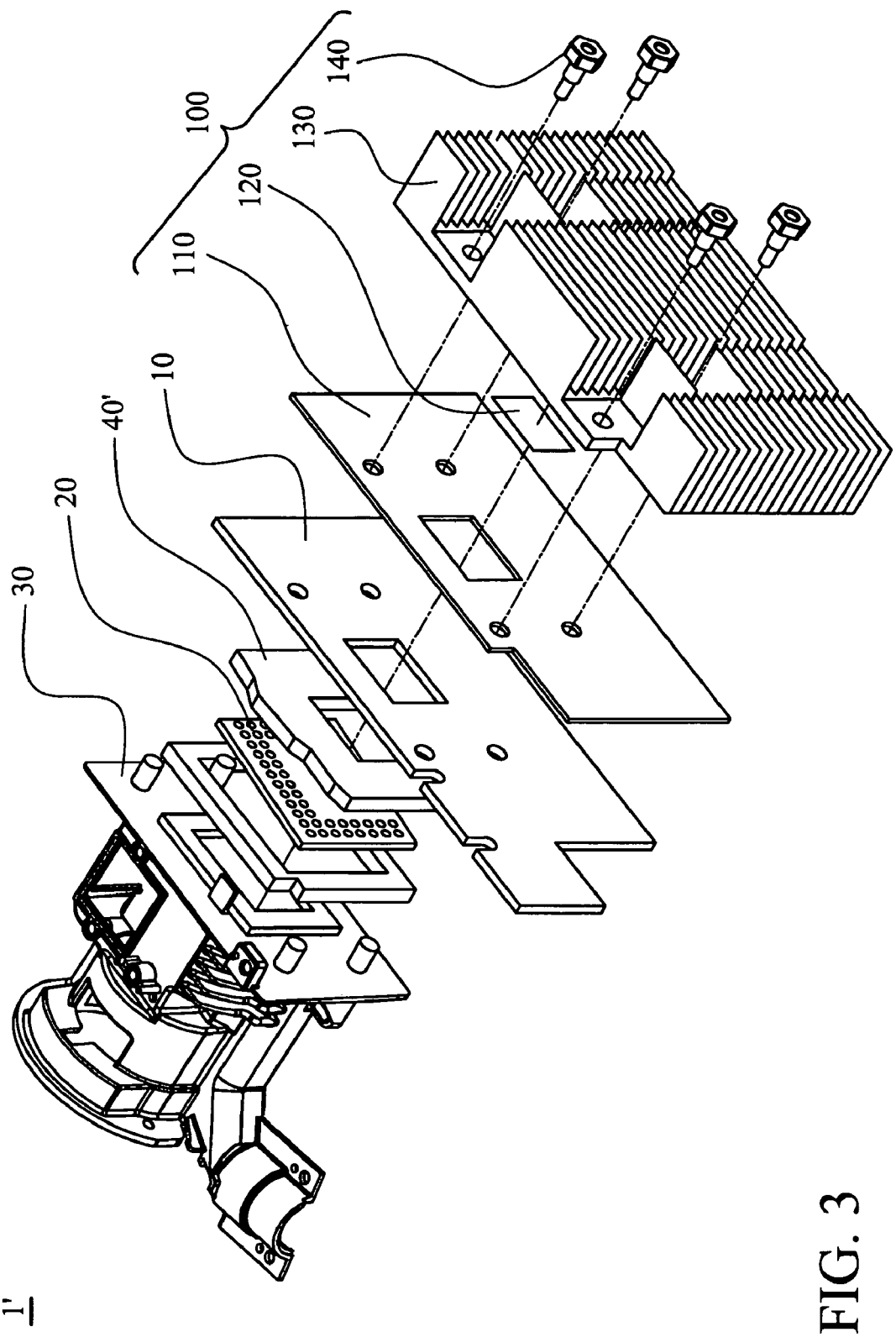
FIG. 3 shows a DMD module of a second embodiment of the invention.

FIG. 3 shows a DMD module 1' of a second embodiment of the invention. Similar to the first embodiment, the DMD module 1' includes a circuit board 10, a DMD element 20, a socket 40', a housing 30 and a heat conducting unit 100. The heat conducting unit 100 includes a soft elastic pad 110, a heat dissipation pad 120, a heat sink 130 and a plurality of fixers 140. The second embodiment differs from the first embodiment in that the socket 40' is electrically connected to the DMD element 20 and the circuit board 10 via elastic pins.

The foregoing descriptions of the preferred embodiments of the present invention have been presented for purposes of illustration and description. It is not intended to be exhaustive or to limit the present invention to a precise form or to the exemplary embodiments disclosed. Accordingly, the foregoing description should be regarded as illustrative rather than restrictive. Obviously, a variety of modifications and variations will be apparent to those with ordinary skill in the art. Moreover, the embodiments are chosen and described in order to best explain the principles of the present invention and its best mode practical applications, to enable those with ordinary skill in the art to understand the present invention for implementation of various embodiments and modifications of the present invention, which conform to particular usages or contemplated implementations. It is intended that the scope of the present invention be defined by the claims appended hereto and their equivalents, whereby all terms are meant in their broadest reasonable sense unless otherwise indicated. Therefore, the term "the invention", "the present invention" or the like does not necessarily limit the claim scope to a specific embodiment, and the references to "preferred exemplary embodiments of the present invention" do not imply a limitation on the present invention and no such limitation is to be inferred. The present invention is limited only by the general spirit and scope of the appended claims. The abstract of the present disclosure is provided to comply with the rules required for an abstract, which will allow a searcher to quickly ascertain the subject matter of the technical disclosure of any patent issued related to the present disclosure. It is submitted with the understanding that it will not be used to interpret or limit the scope or meaning of the claims. Meanwhile, any advantages and benefits described in the present disclosure for the present invention may not apply to all embodiments of the present invention. It should be appreciated that variations may be made to the embodiments described herein by those skilled in the art, without departing from the general scope of the present invention as defined by the following claims. Moreover, no element and component in the present disclosure is intended to be dedicated to the public, regardless of whether the element or component is explicitly recited in the following claims.

What is claimed is:

1. A digital micromirror device module, comprising:
a circuit board, comprising a first surface, a second surface and a through hole, wherein the first surface is opposite to the second surface;
a digital micromirror device element, electrically connected to the circuit board;
a soft elastic pad, disposed on the first surface of the circuit board and surrounding the through hole;
a heat dissipation pad, passing through the through hole and contacting the digital micromirror device element; and
a heat sink, wherein the soft elastic pad is sandwiched between the circuit board and the heat sink, the heat dissipation pad is sandwiched between the heat sink and the digital micromirror device element, and the heat sink contacts the soft elastic pad and the heat dissipation pad to apply a force to the soft elastic pad and the heat dissipation pad.

2. The digital micromirror device module as claimed in claim 1, wherein the soft elastic pad is made of rubber.

3. The digital micromirror device module as claimed in claim 1, wherein the heat sink comprises a first abutting area and a second abutting area, wherein the first abutting area contacts the soft elastic pad, the second abutting area contacts the heat dissipation pad, and the second abutting protrudes from the first abutting area.

4. The digital micromirror device module as claimed in claim 1, further comprising a socket disposed on the second surface, wherein the digital micromirror device element is connected to the socket, the socket comprises an electrical contacting area, and the soft elastic pad corresponds to the electrical contacting area.

5. The digital micromirror device module as claimed in claim 1, further comprising a housing and a plurality of fixers, wherein the fixers fix the heat sink and the circuit board to the housing to control a distance between the heat sink and the circuit board and a distance between the heat sink and the digital micromirror device element, simultaneously.

6. The digital micromirror device module as claimed in claim 5, wherein there is no spring telescoped on the fixers.

7. A digital micromirror device module design method, comprising:
providing a digital micromirror device module, comprising:
a circuit board, comprising a first surface, a second surface and a through hole, wherein the first surface is opposite to the second surface;
a digital micromirror device element, electrically connected to the circuit board;
a soft elastic pad, disposed on the first surface of the circuit board and surrounding the through hole;
a heat dissipation pad, passing through the through hole and contacting the digital micromirror device element; and
a heat sink, wherein the soft elastic pad is sandwiched between the circuit board and the heat sink, the heat dissipation pad is sandwiched between the heat sink and the digital micromirror device element, and the heat sink contacts the soft elastic pad and the heat dissipation pad to apply a force to the soft elastic pad and the heat dissipation pad;
modifying thickness or material of the soft elastic pad, so as to use the force provided by the soft elastic pad to modify an electrical load; and
modifying thickness or material of the heat dissipation pad, so as to use the force provided by the heat dissipation pad to modify a thermal load.

8. The digital micromirror device module design method as claimed in claim 7, wherein the heat sink comprises a first abutting area and a second abutting area, the first abutting area contacts the soft elastic pad, the second abutting area contacts the heat dissipation pad, and the second abutting protrudes from the first abutting area.

9. The digital micromirror device module design method as claimed in claim 8, wherein the step of providing the digital micromirror device module further comprises designing a height difference between the first and the second abutting areas to modifying the thermal load.

10. The digital micromirror device module design method as claimed in claim 7, wherein the digital micromirror device module further comprises a housing and a plurality of fixers, the fixers fix the heat sink and the circuit board to the housing, so as to control a distance between the heat sink and the circuit board and a distance between the heat sink and the digital micromirror device element, simultaneously.

11. The digital micromirror device module design method as claimed in claim 10, wherein there is no spring telescoped on the fixers.

12. The digital micromirror device module design method as claimed in claim 7, wherein the digital micromirror device module further comprising a socket disposed on the second surface, the digital micromirror device element is connected to the socket, the socket comprises an electrical contacting area, and the soft elastic pad corresponds to the electrical contacting area.

13. The digital micromirror device module design method as claimed in claim 7, wherein the soft elastic pad is made of rubber.

14. A digital micromirror device module, comprising:
a circuit board, comprising a first surface, a second surface and a through hole, wherein the first surface is opposite to the second surface;
a digital micromirror device element, electrically connected to the circuit board; and
a heat conducting unit, connected to the first surface of the circuit board, wherein the heat conducting unit is consisted of:
a soft elastic pad, disposed on the first surface of the circuit board and surrounding the through hole;
a heat dissipation pad, passing through the through hole and contacting the digital micromirror device element; and
a heat sink, wherein the soft elastic pad is sandwiched between the circuit board and the heat sink, the heat dissipation pad is sandwiched between the heat sink and the digital micromirror device element, and the heat sink contacts the soft elastic pad and the heat dissipation pad; and
a plurality of fixers, wherein the fixers fix the heat sink and the circuit board to the housing, so as to control a distance between the heat sink and the circuit board and a distance between the heat sink and the digital micromirror device element, simultaneously.

15. The digital micromirror device module as claimed in claim 14, wherein the soft elastic pad is made of rubber.

16. The digital micromirror device module as claimed in claim 14, wherein the heat sink comprises a first abutting area and a second abutting area, the first abutting area contacts the soft elastic pad, the second abutting area contacts the heat dissipation pad, and the second abutting protrudes from the first abutting area.

17. The digital micromirror device module as claimed in claim 14, further comprising a socket disposed on the second surface, wherein the digital micromirror device element is connected to the socket, the socket comprises an electrical contacting area, and the soft elastic pad corresponds to the electrical contacting area.

18. The digital micromirror device module as claimed in claim 14, further comprising a housing, wherein the fixers fix the heat sink and the circuit board to the housing.

* * * * *